United States Patent
House et al.

(10) Patent No.: US 6,796,270 B2
(45) Date of Patent: Sep. 28, 2004

(54) DEVICE FOR PRODUCING PCVD COATED GLASS TUBES FOR THE DRAWING OF OPTICAL FIBERS

(75) Inventors: Keith L House, Corning, NY (US); Barton G Lane, III, Belmont, MA (US); William B Mattingly, III, Wilmington, NC (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/322,325

(22) Filed: Dec. 18, 2002

(65) Prior Publication Data

US 2003/0124250 A1 Jul. 3, 2003

Related U.S. Application Data

(60) Provisional application No. 60/342,828, filed on Dec. 19, 2001.

(51) Int. Cl.[7] ............................ C23C 16/00; H05H 1/00
(52) U.S. Cl. ........................... 118/723 MW; 156/345.41
(58) Field of Search ................................. 118/723 MW, 118/723 ME, 723 MR, 723 MA; 156/345.41, 345.42

(56) References Cited

U.S. PATENT DOCUMENTS

| | | | |
|---|---|---|---|
| 4,207,452 A | * | 6/1980 | Arai ........................... 219/687 |
| 4,714,589 A | | 12/1987 | Auwerda et al. ............. 427/39 |
| 4,844,007 A | | 7/1989 | Eikelboom ................... 118/723 |
| 4,877,938 A | | 10/1989 | Rau et al. ................ 219/121.59 |
| 4,898,118 A | * | 2/1990 | Murakami et al. ... 118/723 ME |
| 5,000,773 A | | 3/1991 | Le Noane et al. ........... 65/3.12 |
| 2003/0104139 A1 | * | 6/2003 | House et al. ............... 427/569 |

* cited by examiner

*Primary Examiner*—Parviz Hassanzadeh
(74) *Attorney, Agent, or Firm*—Robert L. Carlson

(57) ABSTRACT

This invention relates to a device for performing plasma chemical vapor deposition (PCVD) for producing coated glass tubes for the drawing of optical fibers. This invention further relates to a device that uses a microwave applicator, and the applicator itself with a profile that allows for a uniform coating across a greater length of the glass tube.

10 Claims, 3 Drawing Sheets

DEVICE FOR PRODUCING PCVD COATED GLASS TUBES FOR THE DRAWING OF OPTICAL FIBERS

CROSS-REFERENCE TO RELATED APPLICATIONS

This application claims the benefit of priority under 35 U.S.C. § 19(e) of U.S. Provisional Application Serial No. 60/342,828 filed on Dec. 19, 2001.

BACKGROUND OF THE INVENTION

1. Field of the Invention

This invention relates to a device for performing plasma chemical vapor deposition (PCVD) for producing coated glass tubes for the drawing of optical fibers. This invention further relates to a device that uses a microwave applicator, and the applicator itself with a profile that allows for a uniform coating across a greater length of the glass tube.

2. Technology Review

The transmission of communications by means of optical fibers is commercially important today. Optical fibers have acquired an increasingly important role in the field of communications, frequently replacing existing copper wires. This trend has significantly impacted local area networks (i.e., fiber-to-home uses), which has seen a vast increase in the usage of optical fibers. Further increases in the use of optical fibers in local loop telephone and cable TV service are expected, as local fiber networks are established to deliver even greater volumes of information in the form of data, audio and video signals to residential and commercial users.

This form of transmission is done by sending a beam of light through an optically clear fiber. Optical fibers typically contain a glass core, a glass cladding, and at least two polymer coatings, i.e., a primary (or inner) coating and a secondary (or outer) coating. The glass core and cladding of the optical fiber are formed by a number of methods and devices. One of those methods starts by depositing a PCVD coating on the inside of a glass tube by generating a plasma on the inside of a glass tube. The PCVD method of coating a glass tube is distinguished from other methods by its ability to deposit fine layers of glass with high dopant concentrations thereby creating radial optical index profiles with fine radial structure and large index variations. The plasma is created when the gas mixture in the tube is partially ionized by alternating RF or microwave fields. This plasma then dissociates and couples thermal energy into the neutral gas mixture initiating chemical processes which lead eventually to the deposition of doped or undoped glass on the interior of the tube. A schematic of a conventional applicator is shown in FIG. 1. As shown in FIG. 1, substrate tube 1 is positioned within oven 2 and the plasma is traversed along the tube 1 by moving a microwave applicator 9 mechanically within the oven relative to the longitudinal axis of the tube between the two inside ends of the oven (the length between the two inside ends of the oven is herein known as $L_{oven}$). The same single applicator 9 is shown in FIG. 1 at the left most end of a traverse (9A) and at the right most end of a traverse (9B). Between these two positions is the usable product length deposition zone A, as will be discussed below. The microwave applicator, having a maximum length parallel to the longitudinal axis of the tube (herein known as $L_{applicator}$) is mechanically reversed just before the applicator reaches the inside wall of the oven and makes another pass over the tube to create another layer. The microwave applicator continues to make passes until the desired coating thickness and profile is built up. The coated tube is called a hollow preform. The number of layers in the coating and the composition of these layers influences the desired refractive index profile, which is to be employed in the resultant optical fiber. After a glass coating of the desired radial composition profile and of the desired amount has been deposited, the tube (or hollow preform) is collapsed to form a collapsed preform. The collapsed preform can then be drawn directly into optical fiber, or can be overclad then drawn into an optical fiber.

In depositing a coating on an optical fiber preform by PCVD, one of the drawbacks is in the axial uniformity of deposited glass layers along the deposition zone. Deviations in the axial uniformity of the layers along the tube axis occur at the starting and ending regions of the tube near the positions where the applicator direction is reversed. Layer and ultimately coating thickness tapers in these regions. These unusable coating areas are generally at both ends of the tube and are at least the length of the applicator ($L_{applicator}$) at each end of the tube. Therefore, the usable deposition zone ($L_{deposition}$) (that area of the preform where the thickness of the coating layers is substantially the same and where there is no geometric taper) of coated tubes made with conventional coating devices is equal to or less than $L_{oven}-2(L_{applicator})$. The non-axially uniform regions must be removed prior to drawing the optical fiber to prevent quality problems with the fiber, resulting in increased manufacturing expenses as a result of lower yields. This further results in an optical preform that is significantly shorter than that which is theoretically possible and therefore decreases the amount of continuous length of fiber that the manufacturers can produce.

SUMMARY OF THE INVENTION

The present invention is directed to device and a microwave applicator used in the device for producing optical fiber preforms, which may be drawn into optical fibers.

In one embodiment of the present invention, a device for depositing a coating on the inside of a substrate tube is provided which comprises an oven having two end walls for heating the substrate tube, the end walls each having inner and outer surfaces and an opening between the inner and outer surfaces through which the substrate tube can be mounted; and an applicator located in the oven and positioned to be circumferential about a longitudinal axis of the substrate tube for generating a plasma zone from a mixture of gases in the tube by application of energy. The applicator comprises a body and at least one extension positioned about the longitudinal axis of the substrate tube and extending from the body, wherein both the body and the extensions are used to direct energy into the tube and at least one of the extensions has a profile capable of moving at least partially into the opening in the end wall of the oven.

In another embodiment of the present invention, a method of coating the inside of substrate tube is provided which comprises the steps of heating a substrate tube with an oven for heating the substrate tube, the oven comprising two end walls having inner and outer surfaces and an opening between the inner and outer surfaces of each of the end walls through which the substrate tube is mounted; passing a gas mixture through the substrate tube at low pressures; applying energy to react the gas mixture to form a plasma in the substrate tube with an applicator within the furnace, wherein the applicator comprises a body and at least one extension which is substantially symmetric about the substrate tube extending from the body, wherein both the body and the extensions direct the energy into the substrate tube; and moving the applicator along the longitudinal axis of the substrate tube wherein the extension of the applicator has a profile which allows it to move at least partially into the opening in the end wall of the oven.

In still another embodiment of the present invention, a microwave applicator capable of use in an oven at temperatures greater than 1000° C. is provided which comprises a body and at least one extension which is substantially symmetric about a longitudinal axis through the body and the at least one extension, extending from the body, wherein both the body and the extensions are used to direct microwaves into the tube and the at least one extension is capable of withstanding the oven temperatures without being insulated and/or water cooled and without substantially distorting or bending.

In still another embodiment of the present invention, a device for depositing a coating on the inside of a substrate tube is provided which comprises an oven having two end walls having inner and outer surfaces and having a distance between the inner surfaces of the two end walls known as $L_{oven}$; and a microwave applicator comprising a body and at least one extension extending from the body, located in the furnace and circumferentially about the substrate tube mounted through and between the two end walls for generating a plasma in the tube from a mixture of gases by application of microwaves, the microwave applicator having a maximum length along or parallel to the longitudinal axis of the substrate tube known as $L_{applicator}$; wherein the device is capable of depositing a usable film in the tube across a coating deposition zone wherein the length of the usable deposition zone is $L_{deposition\ zone}$, and $L_{deposition\ zone} > L_{oven} - 2(L_{applicator})$. The device and the applicator therefore produce a tube that has a longer usable coated deposition zone.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE INVENTION'S PREFERRED EMBODIMENTS

The present invention is directed to a device, a method of using that device, and a microwave applicator used in the device for producing coated glass tubes used for the production of optical fibers. The device, method and the applicator preferably produce a tube that has a longer usuable coated deposition zone.

Reference will now be made in detail to the present preferred embodiments of the invention, examples of which are illustrated in the accompanying drawings. Wherever possible, the same reference numbers will be used throughout the drawings to refer to the same or like parts.

Figure 1:
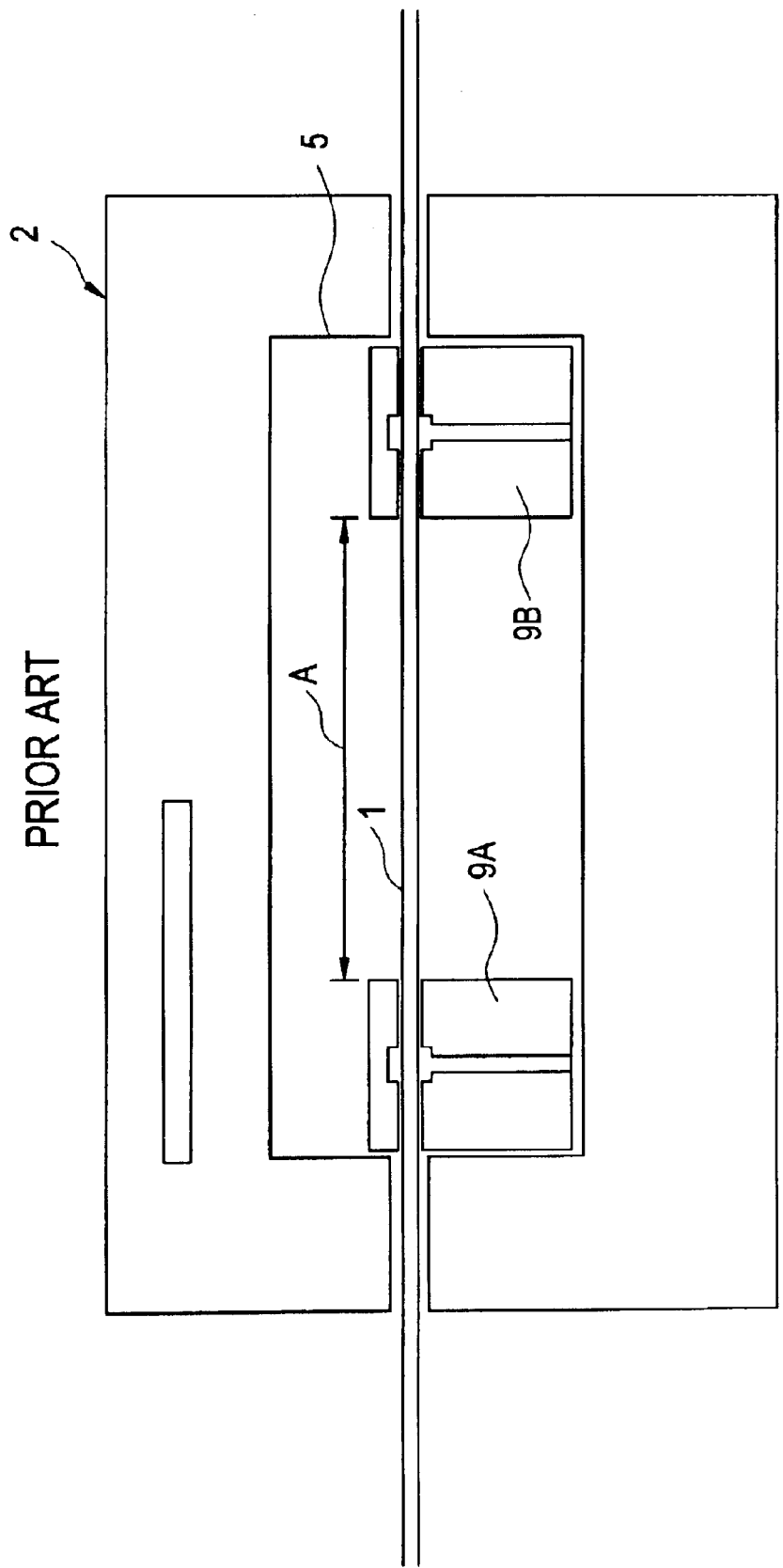
FIG. 1 is a schematic representation of a conventional PCVD coating device.
Figure 2:
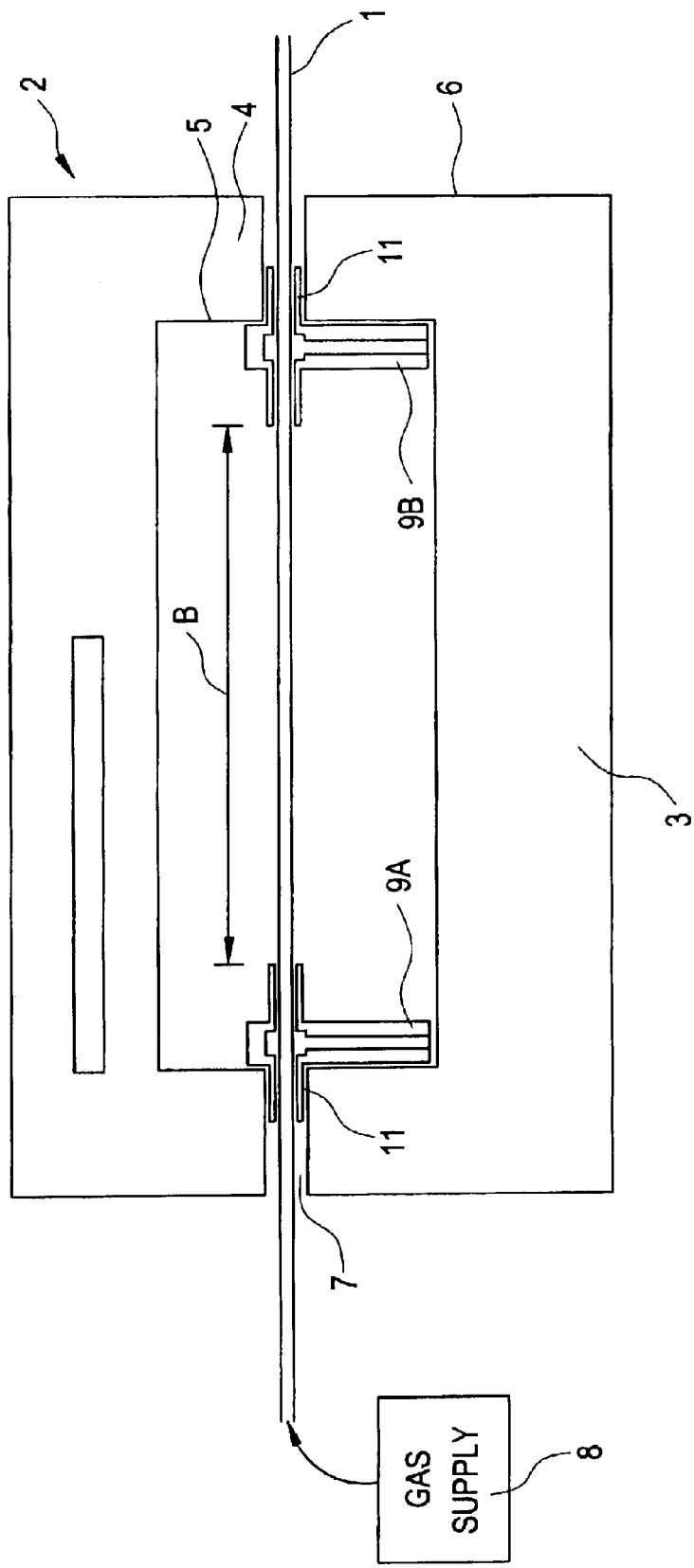
FIG. 2 is a schematic representation of one of the embodiments of the present invention showing a PCVD coating device using microwave applicator.

In one or more embodiments of the present invention, the device comprises an oven for heating the tube and a mixture of gases, and an applicator. FIG. 2 shows a schematic of one specific embodiment of such a device. In this specific embodiment, a gas supply device 8 supplies glass precursor material gases to a substrate tube 1. The oven 2 for heating the substrate tube 1 and the gases can be any type known to those skilled in the art. Preferably, the oven 2 can heat the substrate tube 1 and the gases to above about 1000° C. and more preferably above about 1100° C.

To prevent loss of energy and to reduce temperature fluctuations in the oven 2, the oven 2 is preferably well insulated with a refractory (or insulating) material 3. The oven 2 has two end walls 4 each having an inner surface 5, an outer surface 6 and an opening there through, through which the substrate tube 1 can be mounted. The substrate tube 1 and the insulation 3 at the inner surface 5 of the end walls 4 has a minimum clearance at said inner surface 5 at the inner surface 5 of the end walls 4 which defines the start of the opening 7 in the insulation 3 of the end walls 4. By minimum clearance in this application we mean the minimum distance between the substrate tube 1 and the insulation 3 as measured from the start of the opening 7 at the inner surface 5 of the end walls 4. This minimum clearance helps to prevent loss of energy and to reduce temperature fluctuations in the furnace. Preferably, the diameter at the start of the opening 7 at the inner surface 5 of the end wall 4 is less than the thickness of the end wall 4. Further preferably, the minimum clearance is less than about 8.75 cm, more preferably is less than about 5.0 cm, even more preferably is less than about 2.0 cm, even more preferably is less than about 1.0 cm, and most preferably is less than about 0.5 cm. Preferably, the opening 7 between the inner surface 5 and outer surface 6 of the end wall 4 has a uniform cross section with a substantially uniform clearance along that portion of the extension 11 which enters the end wall 4 of the oven 2. More preferably, the opening 7 in the end wall 4 has an internal shape that is slightly larger in dimensions than the external shape of the extension 11 which enters into the end wall 4. Most preferably, the openings 7 have a cylindrical or conical shape with similar but slightly larger dimensions than the external dimensions of the extensions 11 described later in this application.

Figure 3:
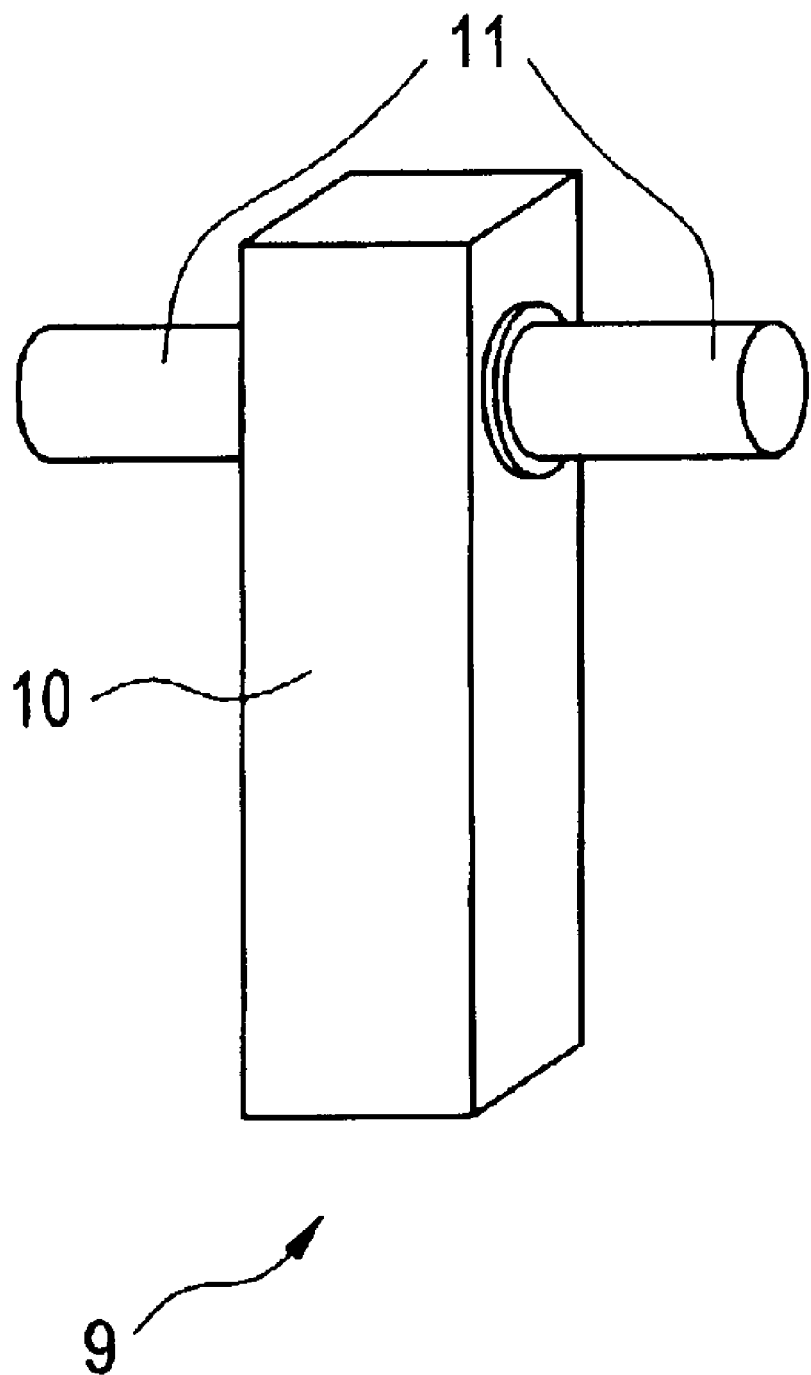
FIG. 3 is a perspective view of one of the embodiments of the present invention showing a microwave applicator.

In this specific embodiment, the applicator 9 is shown in FIG. 2 and in more detail in FIG. 3. The applicator transmits energy that is used to generate a plasma within the substrate tube. In FIG. 2, applicator 9 is shown both at its left most end of a traverse (9A) and at its right most end of a traverse (9B). It should be understood, however, that only a single applicator is employed in the embodiment illustrated in FIG. 2. The energy transmitted by applicator 9 may include, but is not limited to, microwave energy, radio frequency energy and other forms of energy currently known by those skilled in the art or developed in the future, which can be used to generate a plasma. Preferably, the applicator transmits microwave energy.

The applicator 9 is located in the oven 2 and positioned so that it surrounds the substrate tube 1 for generating a plasma zone from a mixture of gases in the tube by application of the energy. Preferably, the applicator 9 is mechanically mounted with the proper drive mechanism and controls to allow it to traverse back and forth along the longitudinal axis of the substrate tube 1. Also preferably, the microwave applicator comprises a body 10 and at least one extension 11, as best illustrated in FIG. 3, and more preferably two extensions 11 that are substantially symmetric circumferentially about the longitudinal axis of the substrate tube 1, extending from the body 10. Also preferably, the body 10 and the at least one extension 11 of the microwave applicator 9 form a chamber to apply or direct energy into the gases in the substrate tube 1 efficiently and uniformly.

Preferably, the body 10 is insulated and/or water-cooled. As embodied herein, the body 10 can be directly water cooled, a water cooling jacket can be applied over the body 10, the body 10 can have a refractory coating, an insulating jacket can be applied over the body 10 or some combination of the aforementioned thereof by methods or other techniques for cooling can be employed which are known to those skilled in the art. Alternatively, a body 10 can be employed in which the extensions 11 are not insulated and/or water cooled; only the body 10 is insulated and/or water cooled; or the body 10 and one of the extensions 11 is insulated and/or water cooled. If the material of the body 10 and one or more of the extensions 11 are dissimilar, then the design of the applicator 9 should preferably take into account thermal expansion and/or contraction differences in the materials in the means used to join the body 10 and extensions 11 to prevent stresses from building up during the heating and cooling of the applicator 9.

Preferably, at least one of the extensions 11 is capable of withstanding the furnace temperatures without being insulated and/or water-cooled. More preferably the extensions 11 are as thin as possible so that the heat load due to thermal conduction back to the body 10 of the microwave applicator 9 is as small as possible. To withstand these types of furnace temperatures, the extension 11 preferably is made out of a material capable of withstanding high temperatures without substantial distortion or bending, and prevents leakage of the microwaves. Substantial distortion or bending is defined as where the material, and therefore the applicator and/or extension distort or bend enough to cause the extension to contact the substrate tube or the insulation at some point along the applicator and/or extension during normal operation. More preferably, by way of example and not limitation, the materials that the extension 11 can be made from one or more materials selected from the group consisting of platinum, inconel, graphite, aluminum oxide, boron nitride, tantalum, tungsten, silicon carbide, platinum-rhodium and combinations thereof. Most preferably, the extension is made from platinum-rhodium.

Preferably, at least one of the extensions 11 has an external profile capable of moving at least partially into the opening 7 of the end wall 4 of the oven 2. More preferably, the extension 11 has a profile capable of moving substantially all of the extension 11 into the opening 7 of the end wall 4 of the oven 2. Preferably, the extension is cylindrical or conical in shape. More preferably, the profile of the applicator has slightly smaller outside dimensions than the inside dimensions of the opening 7 in the end wall 4 of the oven 2.

For purposes of better defining one or more embodiments of the present invention in this application, with one extension 11, the extensions length is defined as $L_1$. With two extensions 11, the extensions 11 are defined as having lengths of $L_1$ and $L_2$. Preferably $L_1$ and $L_2$ are at least approximately equal. Preferably, at least one of the extensions has an external profile allowing the applicator 9 to be mechanically moved along the longitudinal axis of the substrate tube 1 and into the end wall 4. The applicator chamber (not shown) within the applicator, as well as each extension of the tube must have a minimum internal dimension that is greater than the outside radius of the substrate tube 1 to enable the applicator to reciprocate back and forth along the substrate tube 1. Because the external profile of the extension 11 allows the extension to enter the opening 7 of the end wall 4, the applicator 9 does not need to be reversed until the point just before either the body 10 and/or the extension 11 meets the inner surface 5 of the end wall 4 at any one point. As illustrated in FIG. 2, this provides for a greater deposition length and length of usable coating B in the substrate tubes 1 resulting in lower production losses. A usable coating deposition zone is defined as that area or region of the deposition zone where there are no substantial axial or geometric deviations in the thickness of the coating, or no taper in the coating. Preferably, the coating in the usable coating deposition zone does not deviate in thickness more than about 10% in thickness from the average thickness entire deposition zone, more preferably not more than about 5% and most preferably not more than about 2%. Where the applicator 9 is reversed will depend on the external profile of the extension 11 based on the minimum clearance at the start of the opening 7, and the opening 7 of the insulation. Preferably, at least one of the extensions 11 is substantially symmetric about the longitudinal axis of the substrate tube 1, more preferably both of the extensions 11 are substantially symmetric about the longitudinal axis of the substrate tube 1. More preferably, the substantially symmetric extension 11 is cylindrical or conical in shape.

In one or more embodiments of the present invention, the usable coating deposition zone created with the device, applicator or by a method of using the device can be described as follows:

$$L_{deposition\ zone} > L_{furnace} - 2(L_{applicator})$$

Where $L_{deposition}$ zone is the length of the usable coating deposition zone, $L_{furnace}$ is the inside length between the inside surfaces of the two end walls as measured along the longitudinal axis of the substrate tube, and $L_{applicator}$ is the longest cross-section of the applicator as measured parallel to the longitudinal axis of the substrate tube. Preferably, the uniform coating deposition zone created with the device or by a method of using the device can be further described as follows:

$$L_{deposition\ zone} > L_{furnace} - 2(L_{applicator}) + xL_1$$

Where $L_{deposition\ zone}$, $L_{furnace}$, and $L_{applicator}$ have been defined above, $L_1$ is the length of an extension 11, and x is preferably equal to about 0.5, more preferably equal to about 1, more preferably equal to about 1.5 and most preferably equal to about 2.0.

In one or more embodiments of the present invention, preferably, the substrate tube 1 is substantially transparent to the energy being applied via the applicator 9 (e.g., microwave, radio frequency, etc) if the coating is to be formed on the inside of the substrate tube 1. Also preferably, the substrate tube 1 is made from glass, and more preferably the substrate tube 1 is made from high purity fused silica.

In one or more embodiments of the present invention, the gas supply device 8 for supplying a mixture of gases into the substrate tube 1 can be any type known to those skilled in the art. The gas supply device 8 consists of the proper piping, valves, monitors to allow for the proper mixing and delivery of the desired mixture of gases to the substrate tube 1 to form the desired layer of glass on the substrate tube 1. Preferably, the basic gases supplied are $SiCl_4$ and $O_2$, however, depending on the properties desired for the core of the optical fiber ultimately produced, various modifiers and/or dopants can be added through the addition of other gases and/or vapors. The gas mixture is supplied at low pressures in the substrate tube as required to sustain a plasma and to prevent $SiO_2$ formation in the gas stream. Preferably, the pressure in the substrate tube 1 is from about 0.1 to about 75 Torr, more preferably is from about 0.2 to about 30 Torr, and most preferably from about 1 to about 20 Torr.

In one or more embodiments of the present invention, the method of coating the inside of substrate tube 1 comprises the steps of heating a substrate tube within an oven 2 having two end walls 4 for heating the substrate tube 1, the end walls 4 having inner 5 and outer 6 surfaces and an opening 7, between the inner 5 and outer 6 surfaces of each of the end walls 4 through which the substrate tube 1 is mounted; passing a gas mixture through the substrate tube 1 at low pressures; applying energy to react the gas mixture to form a plasma in the substrate tube with an applicator 9 within the furnace, wherein the applicator 9 comprises a body 10 and two extensions 11 which are substantially symmetric about the substrate tube 1 extending from the body 10, wherein both the body 10 and the extensions 11 direct the energy into the substrate tube 1; and moving the applicator 9 along the longitudinal axis of the substrate tube 1 wherein the extension 11 of the applicator 9 has a profile which allows it to move at least partially into the opening 7 in the end wall 4 of the oven 2.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed:

1. A device for depositing a coating on the inside of a substrate tube comprising:
    a) an oven for heating the substrate tube, the oven comprising two end walls each having inner and outer surfaces and an opening between the inner and outer surfaces through which the substrate tube can be mounted; and
    b) an applicator located within the oven and positioned to surround a longitudinal axis of the substrate tube for generating a plasma zone from a mixture of gases in the tube by application of energy, the applicator comprising a body and at least one extension positioned about the longitudinal axis of the substrate tube and extending from the body, wherein both the body and the at least one extension are used to direct energy into the tube and the at least one extension has an outer profile capable of moving at least partially into the opening in the end wall of the oven.

2. The device in claim 1, wherein the oven is used at temperatures greater than about 1000° C.

3. The device in claim 2, wherein the start of the opening at the inner surface of the end wall when the substrate tube is mounted has a minimum clearance of less than about 8.75 cm.

4. The device in claim 3, wherein the outer profile of the at least one extension is cylindrical or conical in shape.

5. The device in claim 4, wherein the applicator is a microwave applicator, and the body and the at least one extension are capable of directing microwave energy.

6. The device in claim 5, wherein the at least one extension is further formed of a material which is capable of withstanding the oven temperatures without being insulated and/or water cooled.

7. The device in claim 5, wherein the device is capable of depositing a usable film in the tube across the length of the usable coating deposition zone known as $L_{deposition\ zone}$, $L_{deposition\ zone} > L_{oven} - 2(L_{applicator})$ and $L_{oven}$ is the inside length as measured along the longitudinal axis of the substrate tube between the inside surfaces of the two end walls of the oven, and $L_{applicator}$ is the longest dimension of the applicator as measured parallel to the longitudinal axis of the substrate tube.

8. The device in claim 7, farther comprising a gas supply device for supplying a mixture of gases.

9. A device for depositing a coating on the inside of a substrate tube comprising:
    a) an oven having two end walls having inner and outer surfaces and having a distance between the inner surfaces of the two end walls known as $L_{oven}$; and
    b) a microwave applicator comprising a body and at least one extension extending from the body, located in the furnace and circumferentially about the substrate tube mounted through and between the two end walls for generating a plasma in the tube from a mixture of gases by application of microwaves, the microwave applicator having a maximum length along or parallel to the longitudinal axis of the substrate tube known as $L_{applicator}$;
    wherein the device is capable of depositing a usable film in the tube across an usable coating deposition zone wherein the length of the zone is usable coating deposition zone wherein the length of the zone is $L_{deposition\ zone}$, and $L_{deposition\ zone} > L_{oven} - 2(L_{applicator})$.

10. The device in claim 9, wherein $L_{deposition\ zone} > L_{furnace} - 2(L_{applicator}) + xL_1$, $L_1$ is the length of one of the extensions, and x is about 1.

* * * * *

UNITED STATES PATENT AND TRADEMARK OFFICE
CERTIFICATE OF CORRECTION

PATENT NO. : 6,796,270 B2
DATED : September 28, 2004
INVENTOR(S) : House, Keith L. et al.

It is certified that error appears in the above-identified patent and that said Letters Patent is hereby corrected as shown below:

Column 8,
Line 29, "8. The device in claim 7, farther comprising a gas supply" should be -- 8. The device in claim 7, further comprising a gas supply --
Lines 47-49, "wherein the length of the zone is usable coating deposition zone wherein the length of the zone is $L_{deposition\ zone}$, and $L_{deposition\ zone} > L_{oven} - 2(L_{applicator})$." should be -- wherein the length of the zone is $L_{deposition\ zone}$, and $L_{deposition\ zone} > L_{oven} - 2(L_{applicator})$. --
Line 51, "$L_{deposition\ zone} > L_{furnace} - 2(L_{applicator}) + xL_1$, $L_1$ is the length" should be -- $L_{deposition\ zone} \geq L_{furnace} - 2(L_{applicator}) + xL_1$, $L_1$ is the length --

Signed and Sealed this

Twenty-first day of December, 2004

JON W. DUDAS
*Director of the United States Patent and Trademark Office*